United States Patent Office 3,563,749

Patented Feb. 16, 1971

3,563,749

LIGHT-SENSITIVE REPRODUCTION MATERIAL

Johannes Munder, Ernst-August Hackmann, and Roland Moraw, Wiesbaden-Biebrich, Germany, assignors to Kalle Aktiengesellschaft, Wiesbaden-Biebrich, Germany, a corporation of Germany No Drawing. Filed Nov. 7, 1966, Ser. No. 592,286
Claims priority, application Germany, Nov. 10, 1965, K 57,618
Int. Cl. G03c *1/52*
U.S. Cl. 96—90 5 Claims

ABSTRACT OF THE DISCLOSURE

Light-sensitive reproduction material useful in preparing negative copies and lithographic plates by means of aqueous development methods is formed by coating a suitable support with a compositon which includes an N-vinyl compound, a halogenated hydrocarbon which splits off halogen when exposed to light, and a merocyanine dye. Light-exposed areas of the material are hydrophobic in nature, readily accept printing inks, and provide for good quality, long run lithographic printing.

The present invention concerns a reproduction material the lightstruck areas of which become visible without further intensification. Upon image-wise exposure of the reproduction material, a copy with reversed tone values is obtained. In a suitable embodiment, the reproduction material of the persent invention may also be used as a printing plate.

It is known to use merocyanine dystuffs for making silver halide-containing reproduction layers sensitive to light in the visible and the infra-red region.

Further, it is known that the color of merocyanine dyestuffs changes when they are exposed to light in the presence of organic halogen compounds and that the solubility characteristics of the exposed areas change at the same time. This effect has already been utilized for reproduction purposes. Thus, a reproduction material consisting of a support and a light-sensitive layer thereon is known from U.S. patent specification No. 3,106,466, in which the light-sensitive layer contains a merocyanine dyestuff of a certain class and a halogenated hydrocarbon which splits off halogen when exposed to light. In addition thereto, the layer may also contain a binder. If this reproduction material is image-wise exposed, a change of color occurs in the image areas. For fixation, the exposed layer is washed with a suitable solvent, e.g., light petroleum ether. Thereby, only the initial dystuffs and the residual halogen compound are removed, whereas the dyestuff formed by exposure remains undissolved on the support. Thus, if the surface of the support used is colorless, a colored copy on a colorless background is obtained after the washing process. Since the image areas are hydrophobic and lyophilic, reproduction material of this type may also be used for offset printing, provided that the said layer was applied to a hydrophillic support. However, the reproduction layers of these materials are relatively insensitive to light, so that long exposure times and light sources of high intensity are required for the formation of images. For these reasons, reproduction materials containing layers of merocyanine dyestuffs and halogen compounds have not become widely used in practice.

Further, reproduction materials are known the light-sensitive layers of which consist essentially of an N-vinyl compound and an organic halogen compound which splits off halogen when exposed to light. Layers containing N-vinyl carbazole and tetrabomomethane are preferably used. Upon image-wise exposure of these layers, a latent, invisible image is produced.

The latent image is made visible by a brief heating step. Thereby, a dyestuff is formed in the exposed areas, so that a copy of the original with reversed tone values is obtained. Reproduction materials of this kind are also suitable for the production of directly legible copies. They are, however, also suitable for the production of printing plates. For this purpose, organic binders, such as polystyrene or wax-like aliphatic hydrocarbons, are added. The exposed areas of such layers cross-link so that they become insoluble in organic solvents. The unexposed areas, on the other hand, retain their solubility in organic solvents. For the preparation of a printing plate, the image-wise exposed layer is therefore washed with an organic solvent, e.g. benzene or carbon tetrachloride. The image areas remain on the support, they are oleophilic. The background is hydrophilic, provided that the surface of the support is sufficiently hydrophilic.

Neither the directly legible reproduction materials nor the printing plates of this type, have, however, become widely used in practice because their light-sensitivity is relatively low and because the quality of the images produced with the hithertoknown materials of this type, as far as sharpness and contrast are concerned, is not sufficient to enable this material to compete with other reproduction materials.

The light-sensitive reproduction material of the present invention consists of a support and a light-sensitive layer disposed thereon which, in principle, is a combination of the components of the two light-sensitive systems mentioned above, viz N-vinyl compound/organic halogen compound and merocyanine dyestuff/organic halogen compound. The layer contains essentially the following four components:

(1) At least one merocyanine dyestuff of the general formula

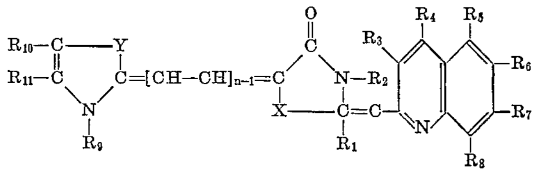

wherein $n$ stands for a whole number from 1 to 4, $R_1$ stands for hydrogen or cyanogen or alkyl residue with up to 4 carbon atoms, $R_2$ stands for hydorgen or a straight-chained or branched alkyl residue with up to 4 carbon atoms, $R_3$, $R_4$, $R_5$, $R_6$, $R_7$ and $R_8$, which may be the same or different, each stand for hydrogen, halogen, cyanide or amino groups which may be alkyl-substituted, alkyl groups with up to 4 carbon atoms, or nitro groups, or may be closed to form a ring when they are in neighboring positions, $R_9$ stands for hydrogen or a straight-chained or branched alkyl residue with up to 4 carbon atoms, $R_{10}$ and $R_{11}$, which may be the same or different, each stand for hydrogen or alkyl residues with up to 4 carbon atoms, or may unite to form a condensed benzene ring, X stands for oxygen, sulphur, >NH, N-alkyl with up to 4 carbon atoms, or the grouping

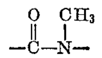

and

Y stands for oxygen, sulphur, selenium or an ethylene group, (2) At least one N-vinyl carbazole, (3) At least one halogenated hydrocarbon which splits off halogen when exposed to light, and (4) A polymeric organic binder which is soluble in an organic solvent.

The reproduction material of the present invention possesses a higher light-sensitivity than the above-described known materials, in combination with the favorable properties of the two systems described i.e. the intense coloration and good contrast of the merocyanine/halogen compound layers and the image-wise hardening of the layer caused by polymerization of the N-vinyl carbazole. Moreover, the novel reproduction material can be used as an offset printing plate, i.e. the image-free areas of the layer are capable of being washed away very easily with water or aqueous solutions. Moreover, the light-sensitivity of the new reproduction material is essentially in the visible region and sufficient to permit exposure to commercial projectors. The latter requirement is essential since negative-working reproduction materials are preferably used for processing negative originals, because positive copies are thus directly obtained. Negative originals are available in large numbers in the form of microfilms on transparent supports. Numerous commercial re-enlargement devices are adapted to the use of such microfilms.

The compounds corresponding to the formulae set forth in the following table, which are designated below as Dyestuffs Nos. 1 to 10, have proved to be particularly suitable merocyanine dyestuffs.

TABLE

Dyestuff No. 1

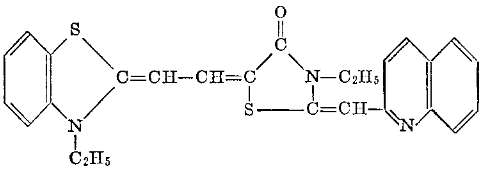

Dyestuff No. 2

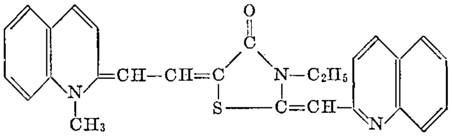

Dyestuff No. 3

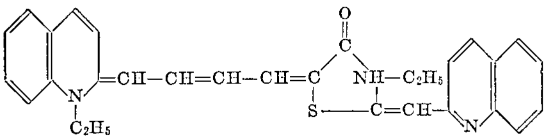

Dyestuff No. 4

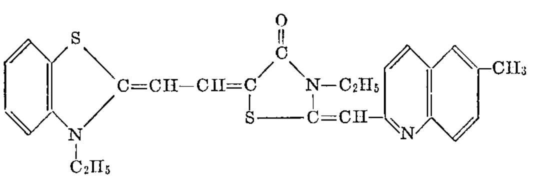

Dyestuff No. 5

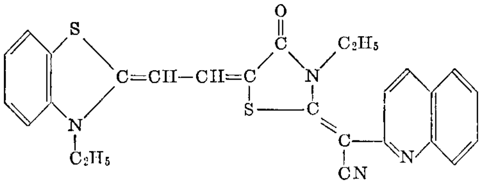

Dyestuff No. 6

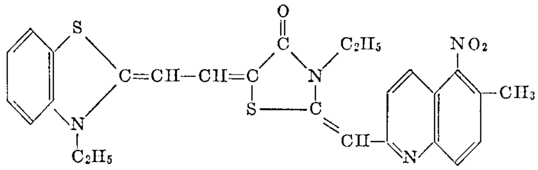

Dyestuff No. 7

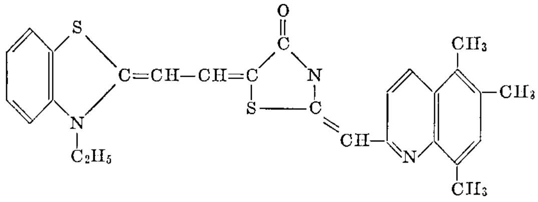

Dyestuff No. 8

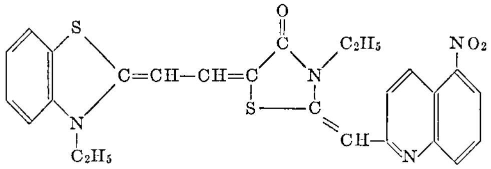

Dyestuff No. 9

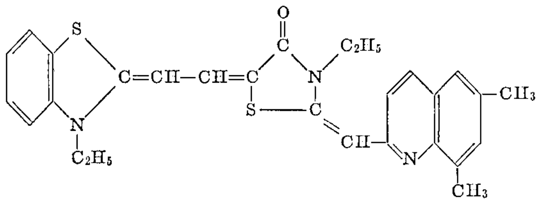

Dyestuff No. 10

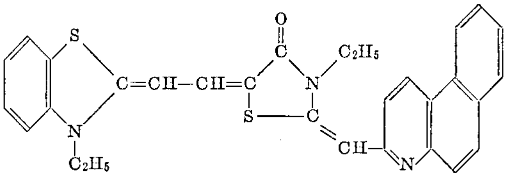

The preparation of such merocyanine compounds is known and has been described, for example, in U.S. patent specification No. 3,109,736. However, other methods of synthesis than those described in this patent specification are also possible.

The term "N-vinyl carbazole," used to define the second component, includes N-vinyli carbazole itself and its substitution products. N-vinyl carbazoles of the following general formula are particularly suitable:

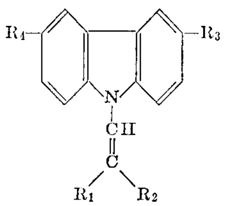

in which $R_1$, $R_2$, $R_3$ and $R_4$ may be the same or different and each stand for hydrogen or a hydrocarbon residue with up to 6 carbon atoms.

The following compounds are mentioned as examples of suitable N-vinyl carbazoles: ω,ω-dimethyl-N-vinyl carbazole and 3,6-dimethyl-N-vinyl carbazole. It is noteworthy that mixtures of these vinyl compounds sometimes give rise to a higher light-sensitivity than do the individual compounds.

Halogenated hydrocarbons which split off halogen when exposed to light more especially have the following general formula

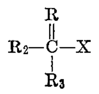

in which $R_1$, $R_2$ and $R_3$ may be the same or different and each stand for chlorine, bromine, iodine, hydrogen, alkyl, aralkyl, alkenyl or heterocyclic groups, or sulphone groups which may, if desired, be substituted by chorine, bromine or iodine.

Within the class of compounds generally defined above as halogen compounds which split off halogen upon exposure, the following deserve particular mention: tetrabromomethane, pentabromomethane, iodoform, tribromomethyl-phenyl-sulphone, and $\omega,\omega,\omega$-tribromoacetophenone substituted once or several times in the aromatic ring by halogen or alkoxy, alkyl or nitro groups, e.g. 3-nitro-$\omega,\omega,\omega$-tribromoacetophenone. Tetrabromopyrrol and tetraiodopyrrol, tetraiodothiophen and tetrabromothiophen, hexachloroethane and tetraiodomethane are also suitable. These compounds may also be contained either individually or in admixture with one another in the light-sensitive layer of the reproduction material according to the invention.

The binders are an essential component of the light-sensitive layer, since the reproduction material according to the invention is to be used as a printing plate. As stated above, the binder must be soluble in an organic solvent. This requirement is essential because the N-vinyl carbazoles and the halogen compounds used dissolve only in organic solvents. Application of the layer from a solution is necessary, however, because a molecular disperse distribution of the light-sensitive compounds in the binder is achieved only in this manner. As far as is known at present, a molecular disperse distribution of the light-sensitive system is required to achieved the best possible effect. Binders which are soluble in an organic solvent as well as in water or an aqueous solution are preferred, because such binders can be applied to the support from an organic solvent, together with the other components of the layer, and may be removed, after image-wise exposure, with water or an aqueous solution. In this manner, the application of an organic solvent in the processing of the reproduction material of the invention can be avoided.

Suitable binders are, for example: alkali-soluble polymers e.g. formaldehyde polycondensates of phenols and cresols and their reaction products with chloroacetic acid, as described, for example, in German patent specification No. 1,053,930, acrylic acid polymers and copolymers with styrene, dimethylbutadiene, vinyl chloride and similar vinyl compounds, maleic anhydride copolymers with styrene, such as vinyl compounds and their semi-esters with alcohols having up to 4 carbon atoms, crotonic acid polymers and copolymers with other vinyl monomers, the proportion of these compounds being advantageously such that the polymers are soluble in aqueous solutions having pH-values ranging from 7.5 to 13. Further, resins may be used which are soluble in acid aqueous solutions with pH-values which preferably range from 3.5 to 6.5. This group includes formaldehyde polycondensates of N,N-dialkyl anilines, preferably dimethylaniline, and substituted dialkyl anilines, further polyvinyl quinoline and other basic polymers of nitrogen-containing heterocyclic vinyl compounds. Polymers which are soluble in neutral water, such as polyvinyl alcohols, polyvinyl-N-methylacetamide, polyvinyl-N-methylformamide and polyvinyl pyrrolidone are also suitable.

Polyvinyl acetate, polystyrene of relatively low molecular weight, cellulose acetate having an acetyl group content between 28 and 48 percent, polyvinyl chloride, polyvinylidene chloride, straight-chained or branched aliphatic hydrocarbons with 10 to 80 carbon atoms and natural and synthetic waxes may also be used. In the case of the latter binders, development must be effected with organic solvents. The binders may also be contained in the layer either individually or in admixture with one another.

The proportion of the individual components in the layer may vary within wide limits. Particularly good results are obtained when 0.001 to 0.01 part by weight of merocyanine dyestuff is used per part by weight of N-vinyl compound. If smaller quantities are included, a distinct effect of the merocyanine dyestuff can still be observed, but this effect is generally not strong enough to enable reproduction materials containing such quantities of merocyanine dyestuffs to be used in the field of microfilm re-enlargement. Without trying to give a theoretical explanation of the light-reaction taking place in the layer, this proves that no ordinary sensitizing effect of the merocyanine dystuffs plays the essential part in the formation of the image, but that the merocyanine dyestuff itself is an essential component of the intensively colored dyestuff formed by exposure to light.

The quantity of the halogen compound contained in the layer may vary within even wider limits. Best results are obtained when 0.5 to 1.5 parts by weight of the light-sensitive halogen compound are contained in the layer per part by weight of N-vinyl compound. Larger quantities of halogen compound show no noticeable advantage, they only serve to render the material more expensive. They are, however, not necessarily disadvantageous.

The binder content of the layer may also vary within wide limits. It depends, to some degree, on the kind of binder used. Some binders, such as poly-N-vinyl pyrrolidone, may be present in the layer in quantities from 2 to 20 percent by weight, based on the quantity of N-vinyl carbazole. Other binders have an even wider range, whereas still other binders have a somewhat narrower range. It may serve as a rule, however, that favorable results are obtained when the binder content of the layer is between 1 and 20 percent by weight, based on the N-vinyl carbazole content of the layer.

The thickness of the light-sensitive layer of reproduction material of the invention may be from $2\mu$ to $20\mu$. If the material is to be used as a printing plate, it is advisable to select a thickness approaching the upper value. In the case of directly readable copies, so-called single copies, a layer thickness bordering the lower limit will, in general, be sufficient.

The layer of the reproduction material according to the present invention is colored in the color of the merocyanine dyestuff contained therein. For instance, it is red if it contains Dyestuff No. 1. When the reproduction material is image-wise exposed, a color change of the layer, in most cases an intensification of the color shade, occurs in the exposed areas. Moreover, the exposed areas undergo a change as regards solubility. It is assumed that this is due mainly to the fact that the N-vinyl carbazole cross-links partially by the light-reaction and that part of the binder and of the dyestuff are entrapped in the polymer formed. Whereas the unexposed reproduction layers dissolve easily in petroleum ether, alcohols or aqueous solutions, depending on the kind of binder used, the exposed areas are insoluble in these solvents. As a result, fixation of the image-wise exposed reproduction material is easily effected by lightly wiping the exposed layer with a cotton pad soaked with the solvent in question. By this treatment, the unexposed areas are removed and the surface of the support used for the reproduction layer becomes visible. If this surface is hydrophilic, the reproduction material according to the invention may be directly used as an offset printing plate.

The spectral sensitivity of the materials is substantially in the same range as the range of absorption of the merocyanine dyestuffs used. Since the maximum absorption of the merocyanine dyestuffs shifts into the longer wave range with an increase in the length of their conjugate chain, reproduction layers covering the whole spectral range of visible light and even part of the infra-red and ultra-violet ranges may be produced. This permits an adaptation of the sensitivity of the layers to the spectral wave ranges emitted by different light sources.

An essential feature of the novel reproduction material, besides its suitability as a printing plate, is that its light-sensitivity is considerably higher than that of the individual components which it contains. A direct comparison of the light-sensitivity of the known materials with that of the material according to the invention is difficult, since the former are either sensitive to the ultra-violet range of light only, or contain other merocyanine dyestuffs which cannot be directly compared. However, the light-sensitivity of the reproduction material according to the invention is such that an exposure in commercial re-enlargement devices, with acceptable exposure times, is possible. Thus, it is for instance possible to produce from a transparent microfilm image of size 24 x 36 mm. a re-enlargement of German standard size DIN A 3, using a commercially available re-enlargement device equipped with a 500 watt tungsten lamp and exposure times ranging from 3 to 30 seconds, depending on the composition of the particular reproduction material used. The light-sensitivity of the two kinds of known materials mentioned above is far from being sufficient for this purpose.

The material of the present invention is not, however, limited to use in projection printing. Contact copies may also be produced. Of course, such contact copies require even shorter exposure times. For instance, with a commercial continuous photoprinting device equipped with a fluorescent lamp connected to a 280 watt source, copies may be prepared within 0.5 to 1 second.

The light-sensitive reproduction material according to the present invention is prepared in the customary manner. A solution which contains at least one merocyanine dyestuff, at least one N-vinyl carbazole, at least one halogen compound and at least one binder in an organic solvent is applied to a suitable support. Acetone is the most suitable solvent. The layer may be applied in the usual manner by whirl-coating or other coating methods. Suitable among the latter are the known dip-coating and roller-coating methods. The conditions under which the freshly coated layers are freed from the solvent used depend on the evaporation characteristics of the solvent and of the halogen compound present. The drying temperature must be selected such that the solvent evaporates but not the halogen compound. When relatively low drying temperatures need to be applied, a correspondingly increased circulation of air over the layer must be caused in order to increase the rate of evaporation of the solvent.

When the solvent cannot be removed without evaporating an essential portion of the halogen compound, or when the reproduction material is to be stored for a particularly long period of time before it is used, then it is advisable only to introduce the halogen compound of the light-sensitive system into the layer shortly before the material is used.

This can be effected by causing a suitable volatile halogen compound, e.g. tetrabromomethane, to diffuse into the layer immediately preceding exposure. Alternatively, it is possible to bring the halogen-free layer into intimate contact with a substance saturated with a halogen compound, for example with a suitably impregnated paper or felt web which passes through a supply tank containing the halogen compound and thus constantly replenishes itself with the halogen compound. The general method by which tetrabromomethane is introduced into such a layer shortly before the material is exposed is known from French patent specification No. 1,221,064.

The support for the light-sensitive layer must be adapted to the intended use of the reproduction material. If the reproduction material of the invention is to be processed to directly readable copies, then a paper support should be used, as is customary. At least the face side of the paper used must be resistant to the solvent from which the layer is applied. Further, the paper should also be resistant to water, also at least on its face side, because after exposure the unexposed portions of the layer are preferably removed from the support by washing with water or aqueous solutions. Moreover, the paper should possess a certain degree of stiffness to permit development by roller application. In order to fulfill these requirements, at least the face side of the paper is provided with one or more coatings. Suitable coating materials are, inter alia: polyvinyl chloride, polyacrylic acid and polymethacrylic acid esters, polystyrene, polyvinylidene chloride, phthalate and maleate resins, and the copolymers of these compounds. These polymeric compounds are insoluble in water and thus protect the underlying paper against attack by water.

Alternatively, a paper which has been rendered resistant to water by a suitable precoat may be coated with a resin which is easily soluble in water. When the latent image is washed with water, the layer which has not been hardened by polymerization is removed from the unexposed areas, so that satisfactory images without background are likewise obtained.

In some cases, it is desirable to produce transparent copies, for instance when they are to be used for the production of further copies by contact exposure. For this purpose, the support used must also be transparent. Glass, transparent films or transparent papers may be used. Films of cellulose acetate, which may be superficially hydrolysed, are preferred. Films consisting of polyethylene terephthalate are used as supports when dimensionally stable transparent copies are required.

Reproduction material according to the present invention having a paper or film support may also be used for offset printing, provided the surface of the support is hydrophilic and the material is of sufficient strength. In general, papers are sufficiently strong which have a weight of more than 120 g./m.$^2$. They may, for instance, carry a thin layer consisting of superficially hydrolysed celluose acetate, in which case they are excellently suited for the preparation of printing plates. It is also possible to render the background hydrophilic after the unexposed light-sensitive layer has been removed by washing.

The hydrophilic areas repel greasy printing ink, whereas the exposed areas, which are covered by the polymerized coating material, accept printing ink. Aluminum foils and sheets of other metals customarily used for planographic printing are preferably used as supports for the reproduction material according to the present invention.

When a suitable support is used, the reproduction material of the invention may also be used for relief and intaglio printing, because the fully exposed layer is fast to etching. Thus, for example, zinc plates may be used as support for the light-sensitive layer. In this case, plates are obtained which, after image-wise exposure and aqueous development, can be etched with nitric acid. The known bimetallic and trimetallic plates may also be used as supports.

Processing of the reproduction material is carried out in the conventional manner. It is exposed in contact with a master or by projection. An image is thus produced which is already visible.

Negative originals are preferably used, because the reproduction material of the invention causes a reversal of the tone values and thus gives a positive copy. In adjusting the exposure time, it is to be recommended to consider the intended use of the copy to be produced. If directly legible copies are to be prepared or printing plates for short runs only, it is not necessary to expose the material until the exposed areas have been completely cross-linked. However, when the copy is to be used as a long run printing plate, complete cross-linking is to be recommended. Fixation after exposure is required, because the unexposed areas are still sensitive to light. As has already been stated, fixation is effected most simply by removing excess merocyanine dyestuff, N-vinyl-compound, halogen compound and binder with a suitable solvent.

After drying for a short time, the copy is ready for use. No further heating is required. The fastness to light of the copies produced in this manner is exceptional, a fact which is quite unexpected in view of the poor light-stability of the merocyanine dyestuffs. All that has been observed is that the color in the image areas may become more intensive by a subsequent exposure to light.

The preparation and use of the reproduction material according to the invention are illustrated by the following examples:

EXAMPLE 1

A solution containing 0.5 percent by weight of "Luviskol" Va 64 (polyvinyl pyrrolidone marketed by BASF, Germany) in acetone is whirl-coated onto baryta paper. Onto the dry layer a solution of the following composition is whirl-coated: 1.5 parts by weight of tetrabromomethane, 1 part by weight of N-vinyl carbazole and 0.025 part by weight of Dyestuff No. 1 of the accompanying drawings dissolved in 10 parts by weight of acetone containing, additionally, approximately 0.1 percent by weight of polyvinyl alcohol N 70–98. After evaporation of the solvent, a re-enlargement on the scale of 1:10 is produced from a silver film negative on the reproduction material thus produced, using a 500 watt Leitz projector and an exposure time of 5 seconds. A strong violet image of the master is obtained on a red background. The light-sensitive layer is wiped over with a cotton pad soaked with water. By this treatment, the areas not struck by light are removed. Simultaneously, part of the dyestuff formed in the image areas is also dissolved. A brownish-black image on a colorless background is obtained. Finally, the copy is dried by means of a hot air blower.

Equally good results are obtained when the "Luviskol" is replaced by poly-N-methyl acetamide.

EXAMPLE 2

A paper prepared as described in Example 1, but containing no tetrabromethane, is suspended, after drying, for 30 seconds in a constant-temperature chamber heated to 70° C. in which tetrabromomethane is kept in an open vessel. The further procedure is as in Example 1, with the exception that an exposure of 15 seconds is necessary to produce an image of equal quality after developing with water.

EXAMPLE 3

A paper printing foil, i.e. a solvent-resistant paper support with a hydrophilic surface, is coated with a solution containing 0.05 part by weight of "Luviskol" Va 64, 2 parts by weight of N-vinyl carbazole, and 0.025 part by weight of Dyestuff No. 1 in 10 parts by weight of acetone. The coating is dried and then wiped over with a solution of 10 g. of nitro-$\omega,\omega,\omega$-tribromo-acetophenone in 100 ml. of methanol. After evaporation of the solvent, the material is exposed for 5 seconds under an original using a 500 watt incandescent lamp at a distance of 50 cm. The material is then developed with water which has been rendered slightly alkaline by the addition of sodium carbonate. The image areas are then inked up with printing ink. A negative image of the master is obtained. A printing plate manufactured in this manner can be used with good results for printing in an offset printing machine.

Equally good results are obtained when a re-enlargement is produced as described in Example 1, using the projector mentioned in Example 1 and an exposure time of 15 seconds.

EXAMPLE 4

Equally good results to those of Example 3 are obtained when the procedure of Example 3 is repeated, replacing Dyestuff No. 1 by the same quantity of Dyestuff No. 5, 7 or 9.

EXAMPLE 5

A 3 percent by weight solution in acetone of a reaction product of a phenol formaldehyde resin and chloroacetic acid, prepared in accordance with German patent specification No. 1,053,930, is whirl-coated onto a support of anodised aluminum and dried. Subsequently, a solution containing 0.1 part by weight of the above-mentioned resin, 2 parts by weight of N-vinyl carbazole, 2 parts by weight of tetrabromomethane and 0.025 part by weight of Dyestuff No. 1 in 10 parts by weight of acetone is applied by whirl-coating. After drying, the material is exposed for 5 seconds under a line original to a 500 watt incandescent lamp at a distance of 50 cm. The exposed plate is then moved to and fro for about 2 minutes in a 20 percent by weight aqueous sodium metasilicate solution, wiped over with a cotton pad, and inked up with printing ink. A negative image of the original is obtained. A printing plate prepared in this manner can be used for printing in an offset printing machine.

Equally good results are obtained when the line original is replaced by a screen original.

Equally good results are also obtained when a re-enlargment in accordance with Example 1 is produced instead of a contact copy. The exposure time is 15 seconds.

Equally good results are likewise obtained when a support consisting of brushed aluminum is used.

EXAMPLE 6

A 3 percent by weight solution of "Lytron 820" (a maleic anhydride/styrene copolymer marketed by Monsanto Chemical Company) in acetone is whirl-coated onto a support consisting of brushed aluminum. After drying, a solution of 2 parts by weight of N-vinyl carbazole, 2 parts by weight of tetrabromomethane, 0.025 part by weight of Dyestuff No. 1 and 0.1 part by weight of "Luviskol" Va 64 in 10 parts by weight of acetone is applied by whirl-coating. After drying, the plate is exposed for 10 seconds under a line original to a 500 watt incandescent lamp at a distance of 50 cm. and then decoated by means of a cotton pad soaked in dilute (3 percent by weight) sodium metasilicate solution. A negative image of the original is thus produced which may be inked with printing ink. A printing plate prepared in this manner may be used for printing in an offset printing machine.

Equally good results are obtained when "Residrol" P 411 or "Residrol" P 420 (phenol resins marketed by Reichhold Chemie A.G., Hamburg) are used instead of "Lytron" 820 for precoating.

EXAMPLE 7

The procedure described in Example 5 is repeated, using a zinc plate as the layer support. After coating, exposure and development, the plate is etched for 10 minutes in a 5 percent by weight solution of nitric acid. By this treatment, the zinc support is deep-etched in the non-image areas, so that a negative relief image of the master is obtained.

A magnesium plate may be used as supporting material with equally good results.

EXAMPLE 8

The procedure described in Example 7 is repeated, using a copper-laminated plastic foil as supporting material. After coating, exposure and development, the copper is dissolved away in the non-exposed areas by means of a 28 percent by weight ferric chloride solution.

EXAMPLE 9

By means of a whirler of the kind customarily used in offset printing, a superficially hydrolysed cellulose acetate film laminated to paper is coated, in red light and at a speed of 125 rotations per minute, with the following solution:

| | Parts by weight |
|---|---|
| Acetone | 10 |
| Dyestuff No. 1 | 0.005 |
| N-vinyl carbazole | 2 |
| Tetrabromomethane | 2 |
| A condensation product of m-cresolformaldehyde resin and chloroacetic acid, prepared in accordance with German patent specification No. 1,053,930 | 0.04 |

After drying, the layer is exposed for 1 minute under a 24 mm. microfilm negative using a re-enlargement reader-printer-device manufactured by the firm Tausch & Simon, of the type Tuska Systematic 3 K, which is equipped with a 200 watt tungsten lamp and enlarges the microfilm to German standard size DIN A 3. After a short wiping with water, the material is inked up with printing ink and may then be used for printing in an offset printing machine.

When nitro-$\omega,\omega,\omega$-tribromoacetophenone is used in the same concentration instead of tetrabromomethane, an image ready for printing is obtained after an exposure of 3 minutes and subsequent development with water, the other conditions being the same.

An equally good printing plate is obtained, under otherwise the same conditions, with 2,5-dimethyl-$\omega,\omega,\omega$-tribromoacetophenone and an exposure time of 2 minutes followed by aqueous development and inking with printing ink.

EXAMPLE 10

Equally good results to those of Example 9 are obtained by following the procedure of Example 9, but replacing Dyestuff No. 1 by the same quantity by weight of Dyestuff No. 6.

EXAMPLE 11

A superficially hydrolysed cellulose acetate film laminated to paper is coated by means of a whirler rotating at 125 revolutions per minute with a solution consisting of:

| | Parts by weight |
|---|---|
| Butyl acetate | 10 |
| Dyestuff No. 1 | 0.005 |
| N-vinyl carbazole | 2 |
| A condensation product of m-cresol formaldehyde resin and chloroacetic acid, prepared as described in German patent specification No. 1,053,930 | 0.04 |

After drying, the film is wiped over with a solution of 10 parts by weight of tetrabromomethane in 100 parts by weight of methanol. After drying, a re-enlargement of German standard size DIN A 3 is produced on this film from a 24 mm. microfilm by an exposure of 15 seconds by means of a projector, e.g. a Leitz projector equipped with a 500 watt tungsten lamp. The image thus formed is developed using a cotton pad soaked with water and inked up with printing ink.

Equally good results are obtained when a film obtained after drying as described above, is covered, during exposure, with a transparent film loaded with tetrabromomethane, which latter film is removed after exposure. After development with an aqueous agent as above and inking with printing ink, the film can be used for printing in an offset printing machine.

EXAMPLE 12

A superficially hydrolysed cellulose acetate film laminated to paper is coated with the solution described in Example 11 by means of a whirler rotating at a speed of 125 revolutions per minute. After drying, the film thus precoated is treated in a closed vessel with tetrabromomethane. The material is exposed for 1 minute in the reader-printer-device mentioned in Example 9 under a 24 mm. microfilm negative, which is thereby enlarged to German standard size DIN A 3, and then developed with water. The image thus produced accepts greasy ink well. It can be used for printing in an offset printing machine.

EXAMPLE 13

A layer of a thickness of about 8$\mu$, prepared from a mixture of 70 percent by weight of aluminum silicate, 20 percent by weight of polyvinyl alcohol having a content of acetylated OH-groups of 2 percent and a K-value of 70, and 10 percent by weight of an aqueous polyvinyl acetate dispersion containing polyvinyl alcohol as protective colloid, is hardened for about 20 seconds at a surface temperature of 125° C. 5 percent by weight of dimethylol urea, based on the polyvinyl alcohol content, is used as cross-linking agent in the mixture and hardening takes place at a pH value of 2. The support used is a 100$\mu$ thick polyethylene terephthalate film provided with a thin adhesive layer of polyurethane glue.

At a speed of rotation of 180 revolutions per minute and in red light, the layer is whirl-coated with the following solution:

| | Parts by weight |
|---|---|
| Dyestuff No. 1 | 0.005 |
| Tetrabromomethane | 2 |
| N-vinyl carbazole | 2 |
| Condensation product of m-cresol formaldehyde resin and chloroacetic acid, prepared as described in German patent specification No. 1,053,930 | 0.04 |
| Acttone | 10 |

and then dried.

By an exposure of 15 seconds to a 500 watt Leitz projector, a reenlargement of German standard size DIN A 3 is produced from a microfilm. After development with water, an intermediate original for use with diazo-type papers is obtained which has good covering power. Alternatively, it is possible to ink the resulting stencil with printing ink and to use it for printing in an offset printing machine.

EXAMPLE 14

Equally good results to those of Example 13 are obtained by following the procedure described in Example 13 using, however, the same quantity by weight of Dyestuff No. 8 or No. 10 instead of Dyestuff No. 1.

EXAMPLE 15

A transparent paper, for example of the kind customarily used in diazotype processes, is coated with a solution which consists of equal parts of methanol and acetone and which contains, per 100 parts by weight of solution, 1 part by weight of "Luviskol" K 90 and 1.3 parts by weight of "Cellit" L 700 (a cellulose acetate lacquer marketed by Farbenfabriken Bayer, Leverkusen), and the layer is then dried. By means of a plate whirler rotating at 180 revolutions per minute, a sensitizing solution is then applied which contains 0.005 part by weight of Dyestuff No. 1, 0.04 part by weight of a condensation product of m-cresol formaldehyde and chloroacetic acid prepared in accordance with German patent specification No. 1,053,-930, 2 parts by weight of tetrabromomethane and 2 parts by weight of N-vinyl carbazole in 10 parts by weight of acetone. After drying, the material is exposed for 5 seconds to a 500 watt Leitz projector, using as original a 24 mm. microfilm which has a density of 0.9 in the solid areas and is enlarged to German standard size DIN A 3. The layer is wiped over with a cotton pad soaked in water which has been adjusted to a pH of 9 by adding sodium metasilicate. A reddish-brown negative copy of the original is obtained which can be used for the production of further copies on diazo-type materials.

EXAMPLE 16

A commercial paper sheet transparentized with wax is coated with a solution containing 0.5 percent by weight of "Luviskol" Va 64 in acetone. After the layer has dried a solution of the following composition is applied: 1.5 parts by weight of tetrabromomethane, 1 part by weight of N-vinyl carbazole and 0.025 part by weight of Dyestuff No. 1 are dissolved in 10 parts by weight of acetone containing 0.1 part by weight of polyvinyl alcohol N 70–98. After evaporation of the solvent, an original to be reproduced, with writing on one side only, is placed on the light-sensitive surface of the reproduction material and both are introduced into a commercially available thermographic apparatus in such a manner that the light-sensitive surface of the reproduction material faces the source of radiation. A change of color occurs in those areas of the reproduction material which are affected by the infra-red radiation. A negative copy of the original is thus obtained, which is fixed by rinsing with water. The copy can be used as intermediate original for the production of further copies.

The above examples have been presented for the purpose of illustration and should not be taken to limit the scope of the present invention. It will be apparent that the described examples are capable of many variations and modifications which are likewise to be included within the scope of the present invention as set forth in the appended claims.

What is claimed is:

1. Light-sensitive reproduction material for the preparation of a printing plate, comprising a support and a light-sensitive composition coated thereon comprising:

(a) an N-vinyl compound;
(b) a halogenated hydrocarbon which splits off halogen when exposed to light;
(c) a polymeric organic binder which is soluble in an organic solvent; and
(d) a merocyanine dye of the general formula:

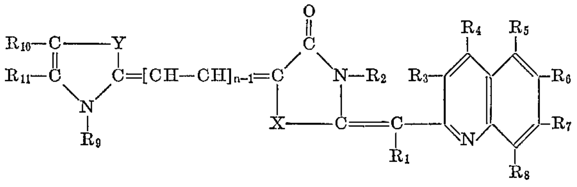

wherein $R_1$ is hydrogen, or a cyanogen or alkyl residue with up to 4 carbon atoms;
$R_2$ is hydrogen, or a straight-chained or branched alkyl residue with up to 4 carbon atoms;
$R_3$, $R_4$, $R_5$, $R_6$, $R_7$, $R_8$ are individually hydrogen, halogen, a cyanide or amino group which may be alkyl-substituted, an alkyl group with up to 4 carbon atoms, a nitro group, or may be united when in neighboring positions to form a closed ring;
$R_9$ is hydrogen, or a straight-chained or branched alkyl residue having up to 4 carbon atoms;
$R_{10}$, $R_{11}$ are individually hydrogen or an alkyl residue with up to 4 carbon atoms, or may be united to form a closed ring;
X is oxygen, sulfur, >NH, N-alkyl with up to 4 carbon atoms, or the grouping

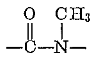

Y is oxygen, sulfur, selenium, or an ethylene group; and
$n$ is a integer from 1 to 4.

2. Material according to claim 1 wherein said N-vinyl compound is selected from the group consisting of N-vinyl amines, N-vinyl amides, and N-vinyl imides.

3. Material according to claim 1 wherein said composition comprises about 0.001 to 0.1 part by weight of merocyanine dye and about 0.1 to 10 parts by weight of light-sensitive halogen compound per part by weight of N-vinyl compound.

4. Printing plate material according to claim 1 wherein said support has a hydrophilic surface and said composition is coated on said surface.

5. The method of making a copy of an original comprising:

(a) providing plate material according to claim 1;
(b) image-wise exposing said material to actinic radiation according to said original, whereby a print-out image is formed;
(c) washing the exposed surface of said material with a solvent for said binder, said solvent being a non-solvent for said print-out image, whereby unexposed areas of said composition are removed from said material;
(d) applying ink to said print-out image remaining on said support; and
(e) transferring the ink image to a receiving surface.

References Cited

UNITED STATES PATENTS

| | | | |
|---|---|---|---|
| 3,042,517 | 7/1962 | Wainer | 96—48 |
| 3,106,466 | 10/1963 | Sprague | 96—48 |
| 3,109,736 | 11/1963 | Sprague | 96—48 |

NORMAN G. TORCHIN, Primary Examiner

J. R. HIGHTOWER, Assistant Examiner

U.S. Cl. X.R.

96—33